United States Patent
Nakamura et al.

(10) Patent No.: US 11,328,956 B2
(45) Date of Patent: May 10, 2022

(54) WAFER PROCESSING METHOD

(71) Applicant: DISCO CORPORATION, Tokyo (JP)

(72) Inventors: Masaru Nakamura, Tokyo (JP);
Hisayuki Yamaoka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 112 days.

(21) Appl. No.: 17/066,658

(22) Filed: Oct. 9, 2020

(65) Prior Publication Data

US 2021/0125870 A1    Apr. 29, 2021

(30) Foreign Application Priority Data

Oct. 28, 2019   (JP) .............................. JP2019-195395

(51) Int. Cl.
| | | |
|---|---|---|
| *H01L 21/78* | (2006.01) | |
| *H01L 21/304* | (2006.01) | |
| *B23K 26/50* | (2014.01) | |
| *B23K 101/40* | (2006.01) | |

(52) U.S. Cl.
CPC .............. *H01L 21/78* (2013.01); *B23K 26/50* (2015.10); *H01L 21/304* (2013.01); *B23K 2101/40* (2018.08)

(58) Field of Classification Search
CPC ....... H01L 21/78; H01L 21/304; B23K 26/50; B23K 2101/40; B23K 26/042; B23K 26/0853; B23K 26/18; B23K 26/53; B23K 26/0006; B23K 2103/56

See application file for complete search history.

(56) References Cited

U.S. PATENT DOCUMENTS

| | | | |
|---|---|---|---|
| 2017/0162521 A1* | 6/2017 | Nakamura | H01L 21/268 |
| 2018/0354067 A1* | 12/2018 | Iizuka | B23K 26/53 |
| 2019/0039187 A1* | 2/2019 | Sekiya | B23K 26/355 |
| 2020/0294856 A1* | 9/2020 | Ono | H01L 23/3171 |

FOREIGN PATENT DOCUMENTS

| | | |
|---|---|---|
| JP | 2002192370 A | 7/2002 |
| JP | 2005184032 A | 7/2005 |

\* cited by examiner

*Primary Examiner* — Thanh T Nguyen

(74) *Attorney, Agent, or Firm* — Greer Burns & Crain Ltd.

(57) ABSTRACT

A wafer processing method includes a modified layer forming step of applying a laser beam of a wavelength having transmitting property to a wafer with a focusing point of the laser beam positioned inside the wafer at positions corresponding to division lines, thereby to form modified layers, and a back side grinding step of holding the wafer on a chuck table of a grinding apparatus, grinding a back side of the wafer to thin the wafer, and dividing the wafer into individual device chips from cracks that are generated from the modified layers formed inside the wafer along the division lines to the division lines formed on a front side of the wafer. In the modified layer forming step, in a case where triangular chips each having a surface area smaller than the device chips are to be formed, the application of the laser beam is stopped in a region where the triangular chips are to be formed.

1 Claim, 4 Drawing Sheets

WAFER PROCESSING METHOD

BACKGROUND OF THE INVENTION

Field of the Invention

The present invention relates to a wafer processing method for dividing a wafer having a device region and a peripheral marginal region into individual device chips, the device region being formed on a front side of the wafer, the front side being partitioned by a plurality of crossing division lines into a plurality of regions where respective devices are formed, the peripheral marginal region surrounding the device region.

Description of the Related Art

A wafer, which has a front side partitioned by a plurality of crossing division lines into a plurality of regions where respective devices such as integrated circuits (ICs) and large scale integrated circuits (LSIs) are formed, is applied with a laser beam of a wavelength having transmitting property to the wafer, with a focusing point of the laser beam positioned inside the wafer at positions corresponding to the division lines, thereby to form modified layers. The wafer is then divided into individual device chips along the modified layers (see Japanese Patent No. 3408805, for example).

There is proposed another technology by which, after modified layers are formed inside a wafer along division lines, the wafer is held on a chuck table of a grinding apparatus such that a front side of the wafer to which a protective tape is attached faces downward, a back side of the wafer is then ground to be thinned, and the wafer is divided into individual device chips (see Japanese Patent No. 4358762, for example).

SUMMARY OF THE INVENTION

According to the technology disclosed in Japanese Patent No. 4358762 mentioned above, since the modified layers are formed to extend from one end to the other end of the wafer along the division lines, not only a device region where devices are formed is divided into individual device chips but also a peripheral marginal region where no device is formed is divided into small pieces when, after the modified layers are formed, the back side of the wafer is ground and the wafer is divided into individual device chips along the modified layers. Particularly, in a region where chips each in a substantially triangular shape smaller in size than the device chips are formed on an outer side in the peripheral marginal region, the triangular chips are scattered at the time of grinding the back side of the wafer because the region is not held by an adhesive force of the protective tape. The scattered chips adhere to the back side of the wafer and, if the wafer is ground by grinding stones of the grinding apparatus with the adhered chips remained on the back side, the grinding stones drag the adhered chips, causing scratches on the back side of the wafer and damages of the device chips.

Accordingly, it is an object of the present invention to provide a wafer processing method that can solve such a problem that, at the time of dividing a wafer into individual device chips by forming modified layers inside the wafer along division lines and grinding a back side of the wafer, substantially triangular minute chips scattered from a peripheral region of the wafer adhere to the back side of the wafer and are dragged by grinding stones, causing scratches on the back side of the wafer and damages of the device chips.

In accordance with an aspect of the present invention, there is provided a wafer processing method for dividing a wafer having a device region and a peripheral marginal region into individual device chips, the device region being formed on a front side of the wafer, the front side being partitioned by a plurality of crossing division lines into a plurality of regions where respective devices are formed, the peripheral marginal region surrounding the device region. The wafer processing method includes: a modified layer forming step of applying a laser beam of a wavelength having transmitting property to the wafer with a focusing point of the laser beam positioned inside the wafer at positions corresponding to the division lines, thereby to form modified layers; a protective member attaching step of attaching a protective member to the front side of the wafer before or after the modified layer forming step; and a back side grinding step of holding the wafer on a chuck table of a grinding apparatus such that the protective member faces downward, grinding a back side of the wafer to thin the wafer, and dividing the wafer into individual device chips from cracks that are generated from the modified layers formed inside the wafer along the division lines to the division lines formed on the front side of the wafer. In the modified layer forming step, in a case where triangular chips each having a surface area smaller than the device chips are to be formed through formation of the modified layers by applying the laser beam on the division lines extending to enter the peripheral marginal region, the application of the laser beam is stopped in a region where the triangular chips are to be formed so as not to form a modified layer in the region, thereby preventing the triangular chips from being formed.

According to the present invention, even when the back side grinding step is carried out in which the back side of the wafer is ground to be thinned and the wafer is divided into individual device chips from the cracks that are generated from the modified layers formed inside the wafer along the division lines to the division lines formed on the front side of the wafer, triangular chips each having a surface area smaller than the device chips are not formed. Accordingly, it is prevented that minute triangular chips scattered from a peripheral region of the wafer adhere to the back side of the wafer and are dragged by grinding stones, causing scratches on the back side of the wafer and damages of the device chips.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

Figure 1:
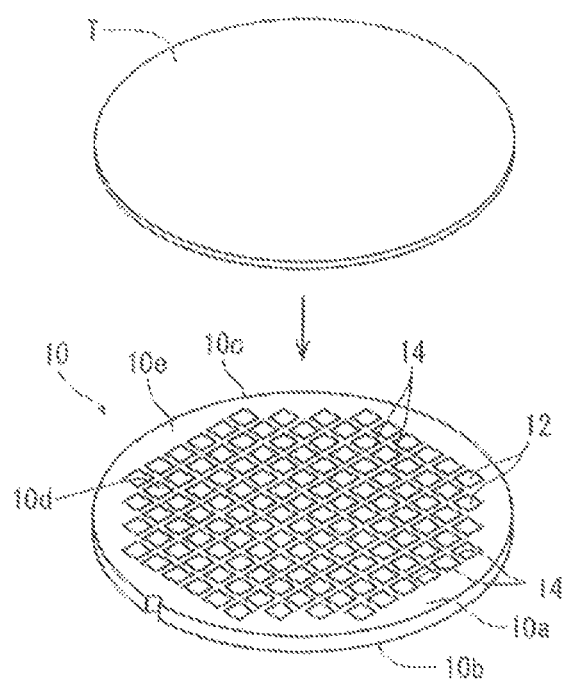
FIG. 1 is a perspective view illustrating a wafer as a workpiece and a protective member according to an embodiment of the present invention.

A wafer processing method according to a preferred embodiment of the present invention will be described below with reference to the attached drawings. FIG. 1 is a perspective view illustrating a wafer 10 to be processed in the wafer processing method of the present embodiment and a protective member T. The wafer 10, for example, includes a silicon substrate and has a front side 10a partitioned by a plurality of crossing division lines 14 into a plurality of regions where respective devices 12 are formed. The wafer 10 has a device region 10d positioned at a center where the plurality of devices 12 are formed and a peripheral marginal region 10e surrounding the device region 10d and having no device 12 formed therein. The protective member T is, for example, a resin sheet having an adhesive paste layer on its front side. The wafer 10 and the protective member T are now prepared, and the protective member T is attached to the wafer 10 such that the paste layer side of the protective member T is in contact with the front side 10a of the wafer 10 as illustrated in FIG. 1 (protective member attaching step).

Figure 2:
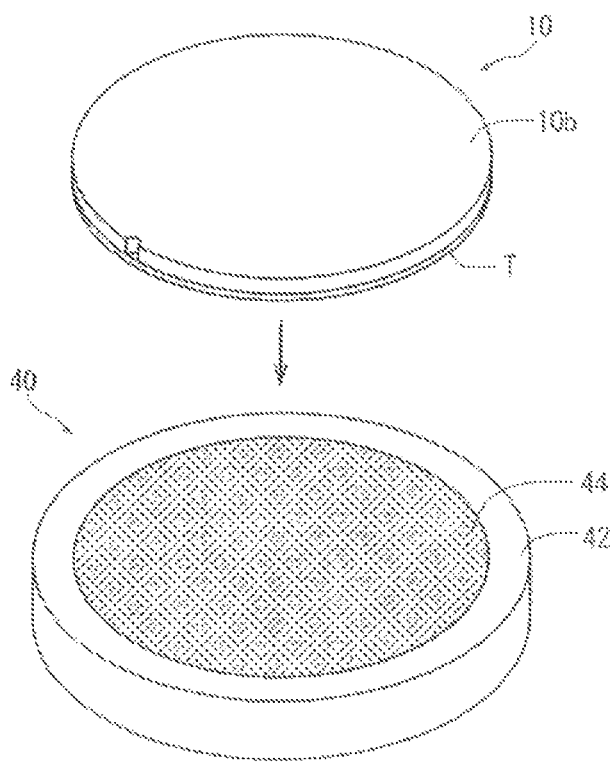
FIG. 2 is a perspective view illustrating a manner in which the wafer to which the protective member illustrated in FIG. 1 has been attached is placed on a chuck table of a laser processing apparatus.

The wafer 10 with the protective member T attached as described above is delivered to a laser processing apparatus 40 partially illustrated in FIG. 2 and FIG. 3 and placed on a suction chuck 44 constituting an upper surface of a chuck table 42 such that the protective member T attached to the front side 10a of the wafer 10 faces downward and a back side 10b of the wafer 10 faces upward. The suction chuck 44 is a member having air permeability and connected to a suction source not illustrated. With the suction source activated, the wafer 10 placed on the chuck table 42 is held under suction on the chuck table 42.

Figure 3A:
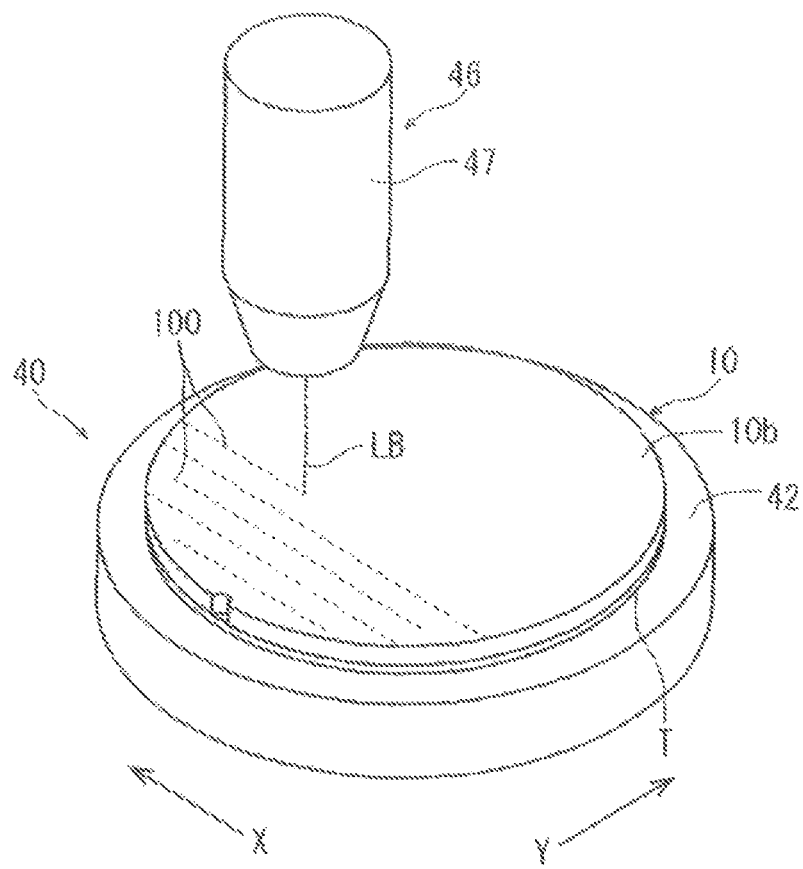
FIG. 3A is a perspective view illustrating a modified layer forming step according to the present embodiment.

After holding the wafer 10 on the chuck table 42 under suction, moving means (illustration omitted) is operated to move the chuck table 42 and position the wafer 10 in alignment means (illustration omitted) provided with an infrared camera. The wafer 10 is imaged from the back side 10b to detect a position in the wafer 10 to be applied with a laser beam LB along one of the division lines 14 (alignment step). After the alignment step is completed, the moving means is further operated to move the chuck table 42 and position the detected position directly below laser beam applying means 46 as illustrated in FIG. 3A.

Figure 3B:
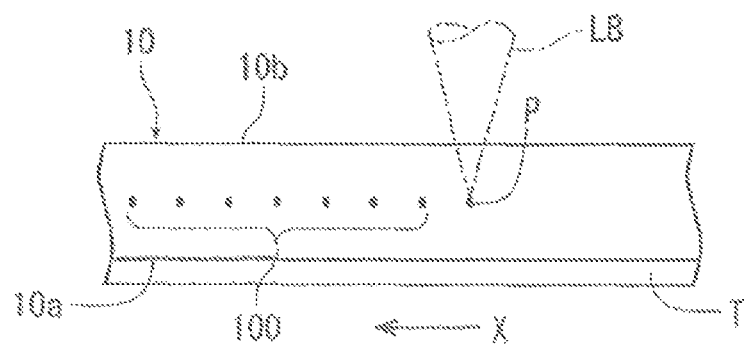
FIG. 3B is a partially enlarged sectional view illustrating a manner in which modified layers are formed inside the wafer in the modified layer forming step illustrated in FIG. 3A.

The laser beam applying means 46 is provided with an optical system (illustration omitted), and the optical system includes a laser oscillator that oscillates a laser of a wavelength having transmitting property to the wafer 10, an attenuator that adjusts an output power of the laser beam LB, a mirror for changing an optical path of the laser beam LB, and the like. The laser beam LB having been transmitted by the optical system is collected by focusing means 47 illustrated in FIG. 3A, and a focusing point P of the laser beam LB is positioned inside the wafer 10 at a position corresponding to one of the division lines 14 as illustrated in FIG. 3B. While operating the laser beam applying means 46 with the focusing point P positioned inside the wafer 10, the chuck table 42 is moved in a processing-feed direction indicated by an arrow X, so that a modified layer 100 is formed along the division line 14 extending in a first direction. After the modified layer 100 is formed along the division line 14, the moving means is operated to move the chuck table 42 in an index-feed direction indicated by an arrow Y, and a modified layer 100 similar to the one described above is then formed along an adjacent division line 14. Successively performing this procedure forms modified layers 100 along all the division lines 14 extending in the first direction in the wafer 10. Then, the chuck table 42 is rotated by 90 degrees, and similar modified layers 100 are formed along all the division lines 14 extending in a second direction perpendicular to the division lines 14 extending in the first direction along which the modified layers 100 have been already formed (modified layer forming step).

Note that the modified layer forming step according to the present embodiment is, for example, carried out under the following laser processing conditions.

Wavelength: 1,342 nm
Repetition frequency: 90 kHz
Average output power: 1.2 W
Processing-feed speed: 700 mm/sec Here, in the case where the laser beam LB is applied to all the division lines 14 that extend to enter the peripheral marginal region 10e to form the modified layers 100 in the wafer 10, triangular chips each having a surface area smaller than device chips formed in a back side grinding step described later are formed in some cases. In the modified layer forming step according to the present embodiment, therefore, the application of the laser beam LB is stopped in a region where the triangular chips are to be formed so as not to form the modified layers 100 in the region, preventing the triangular chips from being formed. This embodiment is further explained below with reference to FIG. 4.

Figure 4:
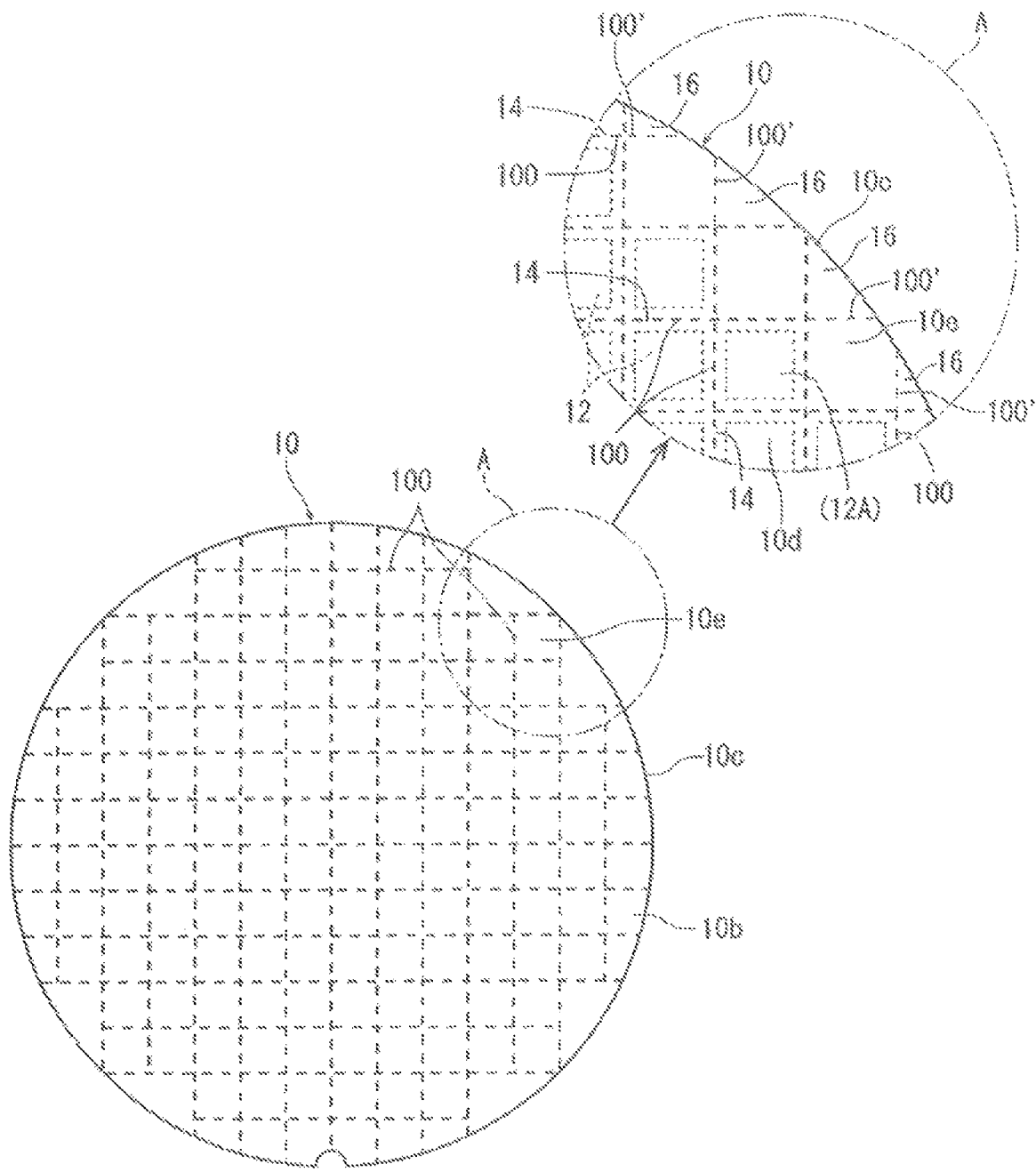
FIG. 4 is a plan view illustrating the entire wafer in which the modified layers have been formed, and further illustrating a region of the wafer in an enlarged manner.

FIG. 4 is a plan view illustrating the wafer 10 in which the modified layers 100 have been formed along the division lines 14. A region A surrounded by a dot-and-dash line in the wafer 10 illustrated in FIG. 4 is shown in an enlarged manner in a right upper part of the figure. The region A, as seen in the enlarged illustration, includes the device region 10d in which the devices 12 (indicated by thin dotted lines) are formed on the front side 10a and the peripheral marginal region 10e surrounding the device region 10d and having no device 12 formed therein.

As illustrated in the enlarged region A of FIG. 4, the modified layers 100 (indicated by thick broken lines) are formed inside the wafer 10 along the division lines 14 in the modified layer forming step described above. If the laser beam LB is applied to the whole length of the division lines 14 extending to enter the peripheral marginal region 10e to form modified layers 100' (indicated by thin broken lines), regions (hereinafter referred to as "minute triangular regions 16") in a substantially triangular shape having a surface area smaller than the regions each surrounded by the modified layers 100 and including the device 12 are formed on a peripheral edge portion 10c side in the peripheral marginal region 10e. If the back side grinding step described later is carried out with the minute triangular regions 16 formed, not only the devices 12 are divided into individual device chips 12A but also the minute triangular regions 16 are separated from the wafer 10, forming triangular chips each having a surface area smaller than the device chips 12A.

In this case, during processing of the back side grinding step, the triangular chips are scattered from the protective member T and adhere to the back side 10b of the wafer 10, and grinding stones drag the adhered chips on the back side 10b, causing damages of the device chips 12A. In the present embodiment, however, the triangular chips each having a surface area smaller than the device chips 12A are prevented from being formed in the following manner. The application of the laser beam LB is stopped in the region in which the above-described minute triangular regions 16 are to be formed, even on extension lines of the division lines 14 as illustrated in the enlarged region A of FIG. 4, so that the modified layers 100' that are to form the triangular chips each having a surface area smaller than the device chips 12A are not formed.

After the modified layer forming step is carried out in the manner described above, the back side grinding step is carried out to divide the wafer 10 into individual device chips 12A. Although, in the embodiment described above, the protective member attaching step is carried out before the modified layer forming step is carried out, the present invention is not limited to this order. The protective member attaching step may be carried out after the modified layer forming step is carried out. Specifically, in the case where the laser beam LB is applied from the front side 10a of the wafer 10 to form the modified layers 100, it is preferable that the protective member attaching step is carried out after the modified layer forming step is carried out. The back side grinding step is explained below with reference to FIG. 5.

The wafer 10 having been subjected to the modified layer forming step is delivered to a grinding apparatus 50 (partially illustrated) and placed on a chuck table 51 of the grinding apparatus 50 such that the protective member T side faces downward and the back side 10b of the wafer 10 faces upward. The grinding apparatus 50 includes the chuck table 51 and grinding means 52. The grinding means 52 includes a wheel mount 54 rotated by an electric motor not illustrated, a grinding wheel 56 mounted on a lower surface of the wheel mount 54, and a plurality of grinding stones 58 disposed in an annular shape on a lower surface of the grinding wheel 56. The chuck table 51 has an upper surface serving as a suction surface that has air permeability and is connected to suction means not illustrated. With the suction means activated, the wafer 10 is held under suction on the chuck table 51.

Figure 5A:
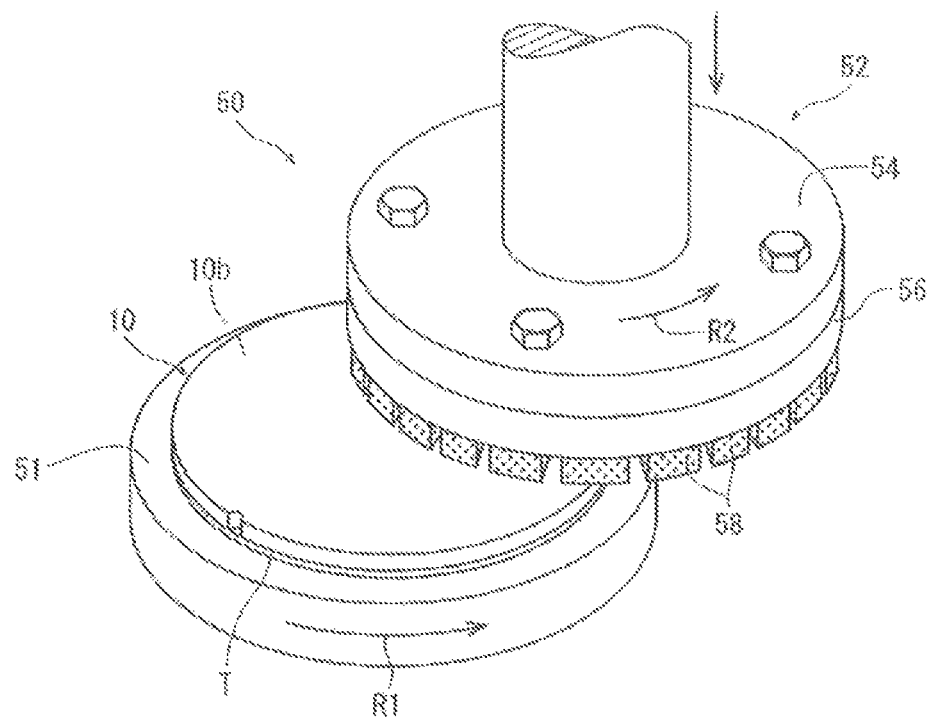
FIG. 5A is a perspective view illustrating a manner in which a back side of the wafer is ground in a back side grinding step.
Figure 5B:
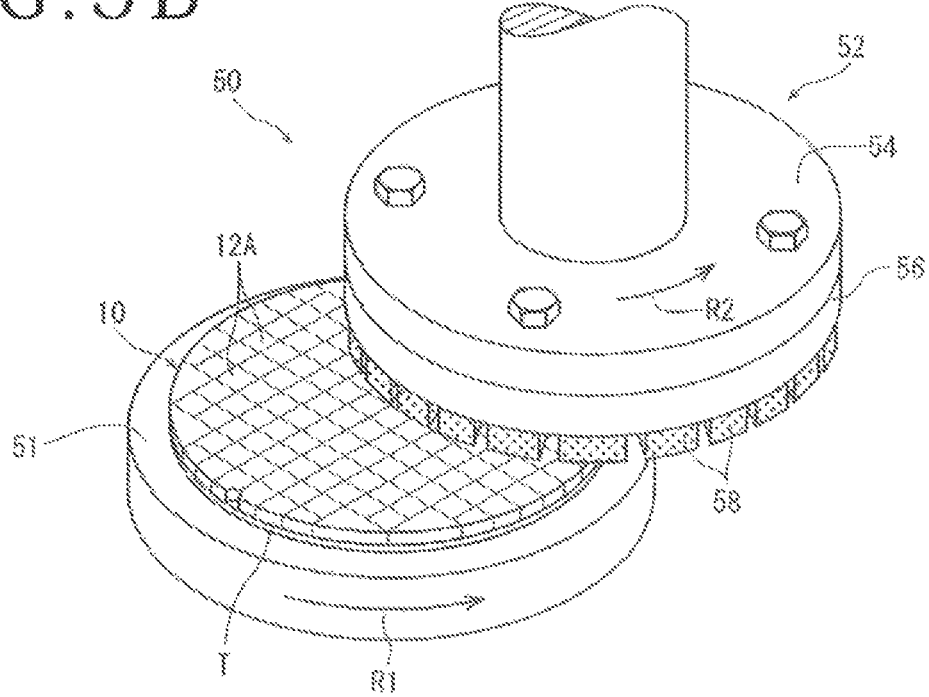
FIG. 5B is a perspective view illustrating a manner in which device chips are formed in the back side grinding step.

After the wafer 10 is held under suction on the chuck table 51, the chuck table 51 is rotated at a speed of 300 rpm, for example, in a direction indicated by an arrow R1 in FIG. 5A while, at the same time, rotating the wheel mount 54 of the grinding means 52 at a speed of 6,000 rpm, for example, in a direction indicated by an arrow R2 in FIG. 5A. Grind-feeding means not illustrated is then operated to lower the grinding stones 58 to make contact with the back side 10b of the wafer 10 from above, and further to grind-feed the grinding stones 58 downward, that is, in a direction perpendicular to the chuck table 51 by a predetermined amount at a grind-feeding speed of 1 μm/sec, for example. In this case, a measuring gauge not illustrated may be used to perform grinding while measuring a thickness of the wafer 10. In this manner, the back side 10b of the wafer 10 is ground to be thinned, and cracks are generated from the modified layers 100, formed inside the wafer 10 along the division lines 14, to the division lines 14 formed on the front side 10a of the wafer 10 as illustrated in FIG. 5B. As a result of generation of the cracks, the wafer 10 is divided into the individual device chips 12A (back side grinding step).

As described above, in the modified layer forming step, the laser beam LB of a wavelength having transmitting property to the wafer 10 is applied to the wafer 10 with the focusing point P positioned inside the wafer 10 at positions corresponding to the division lines 14 to form the modified layers 100. In the back side grinding step, the back side 10b of the wafer 10 is ground to be thinned by the grinding apparatus 50, and the cracks are generated from the modified layers 100, formed inside the wafer 10 along the division lines 14, to the division lines 14 formed on the front side 10a of the wafer 10, thereby to divide the wafer 10 into the individual device chips 12A. According to the embodiment described above, even when the modified layer forming step and the back side grinding step are carried out, triangular chips each having a surface area smaller than the device chips 12A are not formed. Accordingly, it is prevented that minute triangular chips scattered from a peripheral region of the wafer 10 adhere to the back side 10b of the wafer 10 and are dragged by the grinding stones 58, causing scratches on the back side 10b of the wafer 10 and damages of the device chips 12A.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A wafer processing method for dividing a wafer having a device region and a peripheral marginal region into individual device chips, the device region being formed on a front side of the wafer, the front side being partitioned by a plurality of crossing division lines into a plurality of regions where respective devices are formed, the peripheral marginal region surrounding the device region, the wafer processing method comprising:

a modified layer forming step of applying a laser beam of a wavelength having transmitting property to the wafer with a focusing point of the laser beam positioned inside the wafer at positions corresponding to the division lines, thereby to form modified layers;

a protective member attaching step of attaching a protective member to the front side of the wafer before or after the modified layer forming step; and a back side grinding step of holding the wafer on a chuck table of a grinding apparatus such that the protective member faces downward, grinding a back side of the wafer to thin the wafer, and dividing the wafer into individual device chips from cracks that are generated from the modified layers formed inside the wafer along the division lines to the division lines formed on the front side of the wafer, wherein, in the modified layer forming step, in a case where triangular chips each having a surface area smaller than the device chips are to be formed through formation of the modified layers by applying the laser beam on the division lines extending to enter the peripheral marginal region, the application of the laser beam is stopped in a region where the triangular chips are to be formed so as not to form a modified layer in the region, thereby preventing the triangular chips from being formed.

* * * * *